(12) United States Patent
Yu

(10) Patent No.: US 6,559,015 B1
(45) Date of Patent: May 6, 2003

(54) FABRICATION OF FIELD EFFECT TRANSISTOR WITH DUAL LASER THERMAL ANNEAL PROCESSES

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 46 days.

(21) Appl. No.: 09/873,169

(22) Filed: Jun. 1, 2001

(51) Int. Cl.[7] .............................................. H01L 21/336
(52) U.S. Cl. ....................... 438/301; 438/305; 438/311; 438/306
(58) Field of Search ................................. 438/301, 302, 438/303, 305, 306, 680, 682, 522, 533

(56) References Cited

U.S. PATENT DOCUMENTS

| | | | | |
|---|---|---|---|---|
| 5,399,506 A | * | 3/1995 | Tsukamoto | ................. 438/301 |
| 5,998,272 A | * | 12/1999 | Isida et al. | .................. 438/305 |
| 6,200,869 B1 | * | 3/2001 | Yu et al. | ...................... 438/301 |
| 6,284,630 B1 | * | 9/2001 | Yu | ............................... 438/511 |
| 6,287,925 B1 | * | 9/2001 | Yu | ............................... 438/301 |
| 6,335,253 B1 | * | 1/2002 | Chong et al. | ................ 438/305 |

* cited by examiner

Primary Examiner—David Nelms
Assistant Examiner—Dung Anh Le
(74) Attorney, Agent, or Firm—Monica H. Choi

(57) ABSTRACT

For fabricating a field effect transistor on an active device area of a semiconductor substrate, a gate dielectric and a gate electrode are formed on a portion of the active device area. First spacers are formed on sidewalls of the gate electrode and the gate dielectric. A contact dopant is implanted into exposed regions of the active device area to form drain and source contact junctions. A contact laser thermal anneal is performed to activate the contact dopant within the drain and source contact junctions. The first spacers are removed, and an extension dopant is implanted into exposed regions of the active device area to form drain and source extension junctions. An extension laser thermal anneal is performed to activate the extension dopant within the drain and source extension junctions. The fluence of the extension laser thermal anneal is lower than the fluence of the contact laser thermal anneal.

12 Claims, 4 Drawing Sheets

FABRICATION OF FIELD EFFECT TRANSISTOR WITH DUAL LASER THERMAL ANNEAL PROCESSES

TECHNICAL FIELD

The present invention relates generally to fabrication of field effect transistors having scaled-down dimensions, and more particularly, to fabrication of a field effect transistor using dual laser thermal anneal processes for activating dopant within the contact junctions and the extension junctions of the field effect transistor.

BACKGROUND OF THE INVENTION

Referring to FIG. 1, a common component of a monolithic IC is a MOSFET ID (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimensions of the MOSFET 100 are scaled down further, the probability of the occurrence of undesired short channel effects increases because of the short distance between the drain and source extension junctions 104 and 106. Shallow drain and source extension junctions 104 and 106 are desired to minimize short channel is effects. Conventional thermal anneal processes are typically used in the prior art to activate dopant within the drain and source extension junctions 104 and 106 and within the drain and source contact junctions 108 and 112. However, conventional thermal anneal processes which heat up the semiconductor substrate 102 to temperatures above about 900° Celsius cause thermal diffusion of the dopant within the drain and source extension junctions 104 and 106 to increase the depth of the drain and source extensions junctions 104 and 106. Such increased depth of the drain and source extension junctions 104 and 106 enhances the probability of occurrence of the undesired short channel effects.

Thus, a mechanism is desired for activating dopant within the drain and source extension junctions 104 and 106 and within the drain and source contact junctions 108 and 112 without using a conventional thermal anneal process such that the drain and source extension junctions 104 and 106 remain shallow.

SUMMARY OF THE INVENTION

Accordingly, in a general aspect of the present invention, a field effect transistor is fabricated using dual laser thermal anneal processes for activating dopant within the extension and contact junctions of the field effect transistor to maintain the extension junctions to remain shallow.

In one embodiment of the present invention, in a method for fabricating a field effect transistor on an active device area of a semiconductor substrate, a gate dielectric and a gate electrode are formed on a portion of the active device area of the semiconductor substrate. First spacers are formed on sidewalls of the gate electrode and the gate dielectric. A contact dopant is implanted into exposed regions of the active device area of the semiconductor substrate to form a drain contact junction and a source contact junction. A contact laser thermal anneal with a contact laser fluence is performed to activate the contact dopant within the drain and source contact junctions. The first spacers on the sidewalls of the gate electrode and the gate dielectric are removed. An extension dopant is implanted into exposed regions of the active device area of the semiconductor substrate to form a drain extension junction and a source extension junction. An extension laser thermal anneal with an extension laser fluence is performed to activate the extension dopant within the drain and source extension junctions. The extension laser fluence of the extension laser thermal anneal is lower than the contact laser fluence of the contact laser thermal anneal. In this embodiment of the present invention, the extension junctions are formed after the contact junctions are formed.

In another embodiment of the present invention, the contact junctions are formed after the extension junctions are formed. In such an embodiment, in a method for fabricating a field effect transistor on an active device area of a semiconductor substrate, a gate dielectric and a gate electrode are formed on a portion of the active device area of the semiconductor substrate. An extension dopant is implanted into exposed regions of the active device area of the semiconductor substrate to form a drain extension junction and a source extension junction. An extension laser thermal anneal with an extension laser fluence is performed to activate the extension dopant within the drain and source extension junctions. Spacers are formed on sidewalls of the gate electrode and the gate dielectric. A contact dopant is implanted into exposed regions of the active device area of the semiconductor substrate to form a drain contact junction and a source contact junction. A contact laser thermal anneal with a contact laser fluence is performed to activate the contact dopant within the drain and source contact junctions. The steps for forming the contact junctions are performed after the steps for forming the extension junctions. The extension laser fluence of the extension laser thermal anneal is lower than the contact laser fluence of the contact laser thermal anneal.

In this manner, dual laser thermal anneal processes are performed for activating dopant within the contact and extension junctions of the field effect transistor such that a conventional thermal anneal process may not be used to activate dopant within such junctions. In such laser thermal anneal processes, a laser beam is directed toward the junctions for a short time duration of from about 1 nanosecond to about 10 nanoseconds.

With such laser thermal anneal processes, thermal diffusion of dopant within the extension junctions is minimized such that the extension junctions remain shallow to minimize short channel effects of the field effect transistor.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and function.

DETAILED DESCRIPTION

Figure 1:
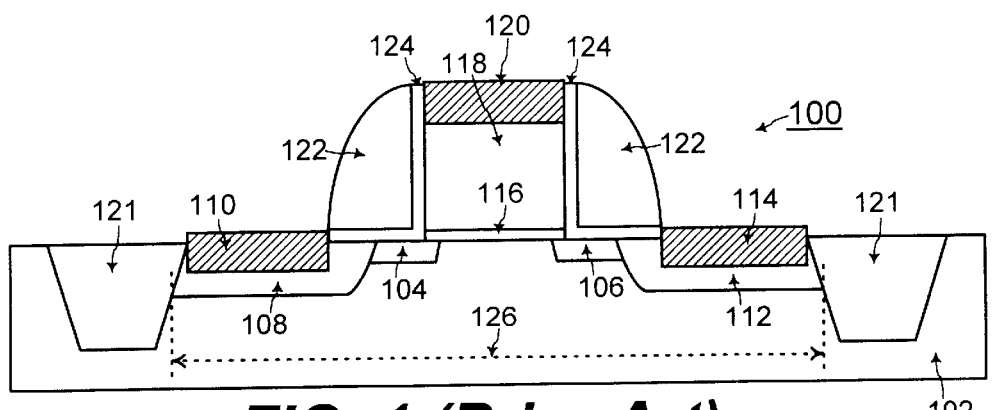
FIG. 1 shows a cross-sectional view of a conventional MOSFET (Metal Oxide Semiconductor Field Effect Transistor), according to the prior art.
Figure 2:
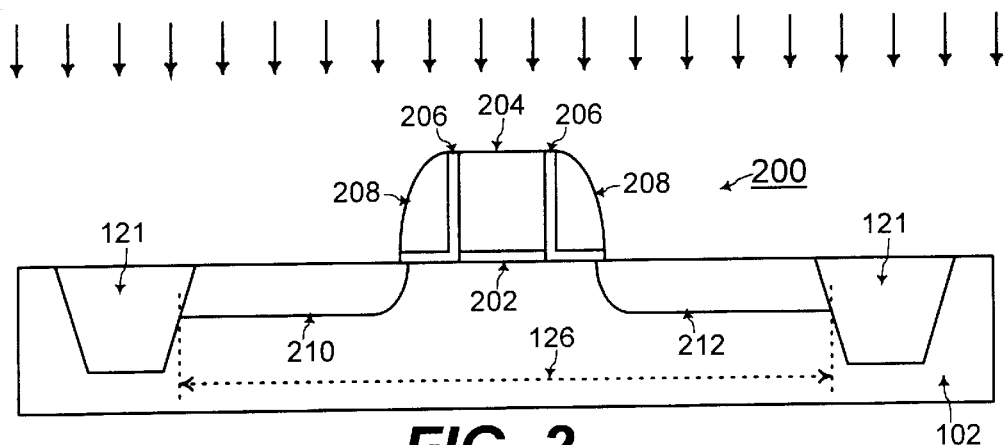
FIGS. 2, 3, 4, 5, 6, and 7 show cross-sectional views for illustrating the steps for fabricating a field effect transistor using dual laser thermal anneal processes for activating dopant within the extension and contact junctions of the field effect transistor to maintain the extension junctions to remain shallow, with the contact junctions being formed before the extension junctions, according to an embodiment of the present invention.

Referring to FIG. 2, in a general aspect of the present invention, a MOSFET (Metal Oxide Semiconductor Field Effect Transistor) 200 of an embodiment of the present invention having shallow drain and source extension junctions is fabricated using dual laser thermal anneal processes. Referring to FIG. 2, a gate dielectric 202 is formed over a portion of the active device area 126 of the semiconductor substrate 102, and a gate electrode 204 is formed over the gate dielectric 202.

The gate dielectric 202 is comprised of silicon dioxide ($SiO_2$) according to one embodiment of the present invention. Alternatively, the gate dielectric 202 is comprised of a dielectric material such as metal oxide for example having a dielectric constant that is higher than that of silicon dioxide ($SiO_2$). When the gate dielectric 202 has a dielectric constant that is higher than the dielectric constant of silicon dioxide ($SiO_2$), the gate dielectric 202 has a higher thickness than if the gate dielectric 202 were comprised of silicon dioxide ($SiO_2$), to minimize undesired tunneling current through the gate dielectric 202. Processes for forming such a gate dielectric 202 are known to one of ordinary skill in the art of integrated circuit fabrication.

The gate electrode 204 is comprised of polysilicon according to one embodiment of the present invention. Processes for forming such a gate electrode 204 are known to one of ordinary skill in the art of integrated circuit fabrication. The present invention may be practiced with other types of materials for the gate dielectric 202 and the gate electrode 204, as would be apparent to one of ordinary skill in the art of integrated circuit fabrication from the description herein.

Further referring to FIG. 2, first spacers 208 are formed at the sidewalls of the gate dielectric 202 and the gate electrode 204. According to one embodiment of the present invention, the first spacers 208 are comprised of silicon nitride ($Si_3N_4$). In that case, a spacer liner oxide 206 is deposited as a buffer layer between the first spacers 208 and the semiconductor substrate 102 and the sidewalls of the gate electrode 204 and the gate dielectric 206. Processes for forming such spacers 208 and spacer liner oxide 206 are known to one of ordinary skill in the art of integrated circuit fabrication. After formation of the first spacers 208, a contact dopant is implanted into exposed regions of the active device area 126 of the semiconductor substrate 102 to form a drain contact junction 210 and a source contact junction 212. The contact dopant is implanted such that the drain and source contact junctions 210 and 212 are relatively deep junctions for later formation of silicide therein. The contact dopant is an N-type dopant such as phosphorous or arsenic for example for fabrication of an NMOSFET (N-channel Metal Oxide Semiconductor Field Effect Transistor). Alternatively, the contact dopant is a P-type dopant such as boron for example for fabrication of a PMOSFET (P-channel Metal Oxide Semiconductor Field Effect Transistor). Processes for implantation of such contact dopant are known to one of ordinary skill in the art of integrated circuit fabrication.

Figure 3:
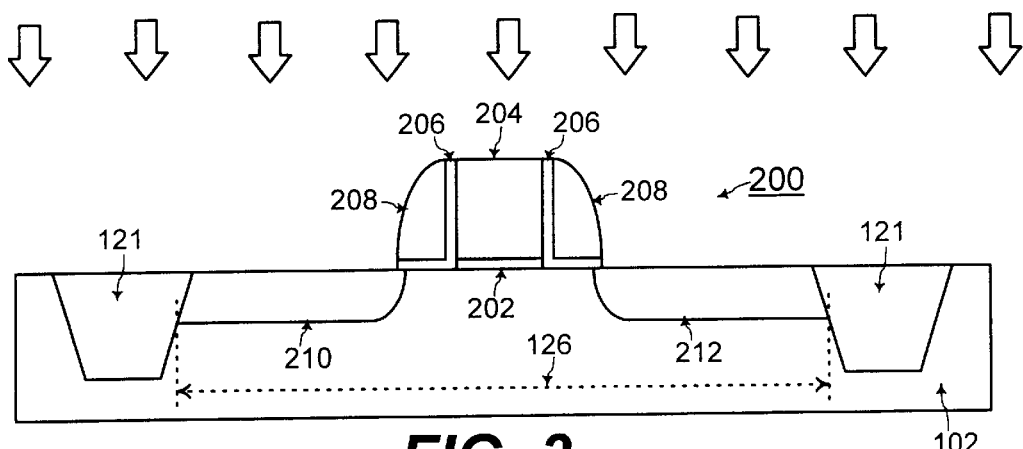

Referring to FIG. 3, the contact dopant within the drain and source contact junctions 210 and 212 is activated in a contact laser thermal anneal process. In such a laser thermal anneal process, a laser beam is directed toward the semiconductor substrate 102. In one embodiment of the present invention, during the contact laser thermal anneal process, a laser beam having a contact fluence in a range of from about 0.5 Joules/cm$^2$ to about 0.8 Joules/cm$^2$ is directed toward the drain and source contact junctions 210 and 212 for a time period of from about 1 nanosecond to about 10 nanoseconds.

In such a short time period, the contact dopant within the drain and source contact junctions 210 and 212 is activated with minimized thermal diffusion of the contact dopant. In addition, the first spacers 208 cover a portion of the semiconductor substrate 102 from being exposed to the laser beams such that the portion of the semiconductor substrate 102 covered under the first spacers 208 does not heat up significantly. In one embodiment of the present invention, the first spacers 108 are comprised of silicon nitride ($Si_3N_4$) instead of silicon dioxide ($SiO_2$) because silicon nitride ($Si_3N_4$) more effectively blocks the laser beams from the semiconductor substrate 102 than silicon dioxide ($SiO_2$) that is transparent. In this manner, the contact dopant remains substantially within the drain and source contact junctions 210 and 212 which may melt into liquid form, and the contact dopant does not diffuse under the first spacers 208 since the semiconductor substrate below the first spacers 208 remain substantially solid. Laser thermal anneal processes in general are known to one of ordinary skill in the art of integrated circuit fabrication.

Figure 4:
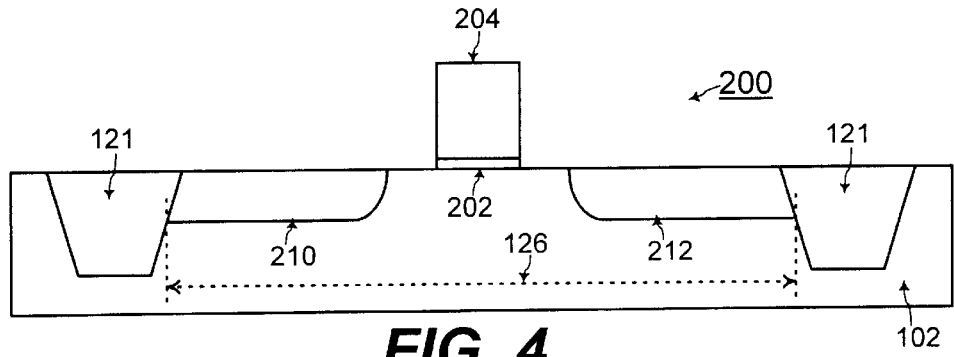

Referring to FIG. 4, after activation of the contact dopant within the drain and source contact junctions 210 and 212, the first spacers 208 and the spacer liner oxide 206 are removed from the sidewalls of the gate dielectric 202 and the gate electrode 204. When the first spacers 208 are comprised of silicon nitride ($Si_3N_4$), heated phosphoric acid ($H_3PO_4$) is used to etch away the first spacers 208 and hydrofluoric acid (HF) is used to etch away the spacer liner oxide 206, according to one embodiment of the present invention. Such processes for etching away the spacer liner oxide 206 and the first spacers 208 are known to one of ordinary skill in the art of integrated circuit fabrication.

Figure 5:
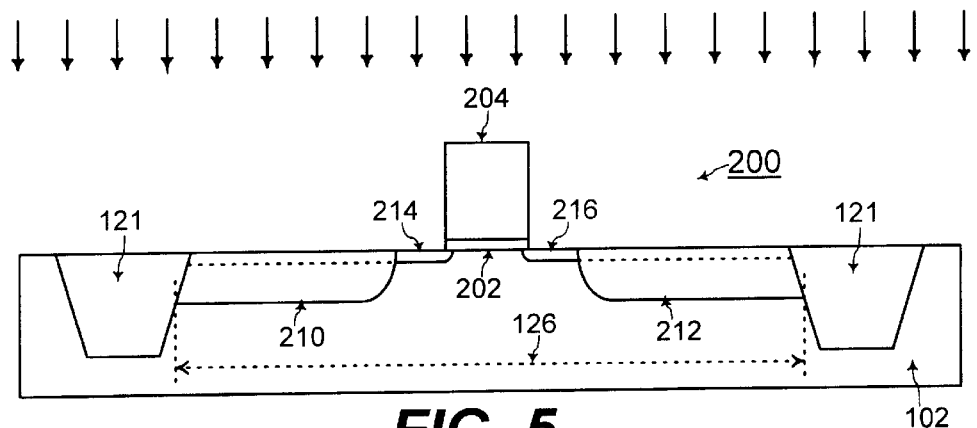

Referring to FIG. 5, after the first spacers 208 and the spacer liner oxide 206 are removed, an extension dopant is implanted into exposed regions of the active device area 126 of the semiconductor substrate 102 to form a drain extension junction 214 and a source extension junction 216. The extension dopant is implanted such that the drain and source extension junctions 214 and 216 are relatively shallow junctions for minimizing short channel effects. The extension dopant is an N-type dopant such as phosphorous or arsenic for example for fabrication of an NMOSFET (N-channel Metal Oxide Semiconductor Field Effect Transistor). Alternatively, the extension dopant is a P-type dopant such as boron for example for fabrication of a PMOSFET (P-channel Metal Oxide Semiconductor Field Effect Transistor). Processes for implantation of such extension dopant are known to one of ordinary skill in the art of integrated circuit fabrication.

Figure 6:
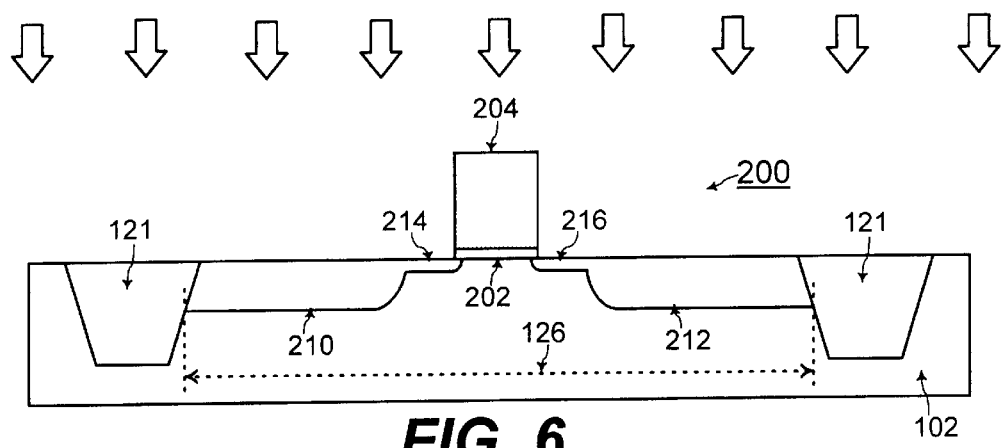

Referring to FIG. 6, the extension dopant within the drain and source extension junctions 214 and 216 is activated in an extension laser thermal anneal process. In such a laser thermal anneal process, a laser beam is directed toward the semiconductor substrate 102. In one embodiment of the present invention, during the extension laser thermal anneal process, a laser beam having an extension fluence in a range of from about 0.2 Joules/$cm^2$ to about 0.4 Joules/$cm^2$ is directed toward the semiconductor substrate 102 including the drain and source extension junctions 214 and 216 for a time period of from about 1 nanosecond to about 10 nanoseconds. In such a short time period, the extension dopant within the drain and source extension junctions 214 and 216 is activated with minimized thermal diffusion of the extension dopant such that the drain and source extension junctions 214 and 216 remain shallow.

Comparing FIGS. 3 and 6, the contact fluence of the contact laser thermal anneal process in FIG. 3 for activating contact dopant within the deeper drain and source contact junctions 210 and 212 is higher than the extension fluence of the extension laser thermal anneal process in FIG. 6 for activating extension dopant within the shallow drain and source extension junctions 214 and 216. Laser thermal anneal processes in general are known to one of ordinary skill in the art of integrated circuit fabrication.

Figure 7:
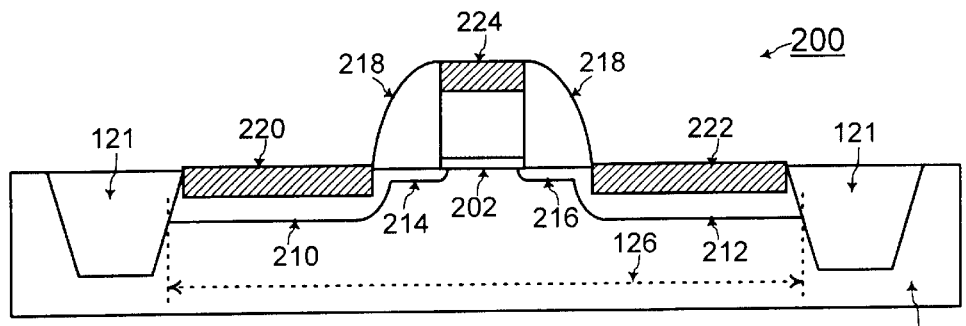

Referring to FIG. 7, after formation of the drain and source contact junctions 210 and 212 and of the drain and source extension junctions 214 and 216, second spacers 218 are formed at the sidewalls of the gate dielectric 202 and the gate electrode 204. The second spacers 218 are comprised of silicon dioxide ($SiO_2$) according to one embodiment of the present invention. Processes for formation of the second spacers 218 are known to one of ordinary skill in the art of integrated circuit fabrication.

Further referring to FIG. 7, a silicidation process is then performed to form a drain silicide 220 with the drain contact junction 210, a source silicide 222 with the source contact junction 212, and a gate silicide 224 with the gate electrode 204. In one embodiment of the present invention, the drain silicide 220, the source silicide 222, and the gate silicide 224 are comprised of nickel silicide (NiSi) formed in a silicidation process using a relatively low temperature in a range of from about 400° Celsius to about 500° Celsius. Such a low temperature further minimizes thermal diffusion of dopant from the drain and source extension junctions 214 and 216 to maintain the drain and source extension junctions 214 and 216 to be shallow.

In this manner, dual laser thermal anneal processes are performed for activating dopant within the contact and extension junctions 210, 212, 214, and 216 of the MOSFET 200 such that conventional thermal anneal processes may not be used to activate the dopant within such junctions. In such laser thermal anneal processes, a laser beam is directed toward the junctions for a short time duration of from about 1 nanosecond to about 10 nanoseconds. With such laser thermal anneal processes, thermal diffusion of dopant within the extension junctions is minimized such that the extension junctions remain shallow to minimize short channel effects of the MOSFET 200.

Figure 8:
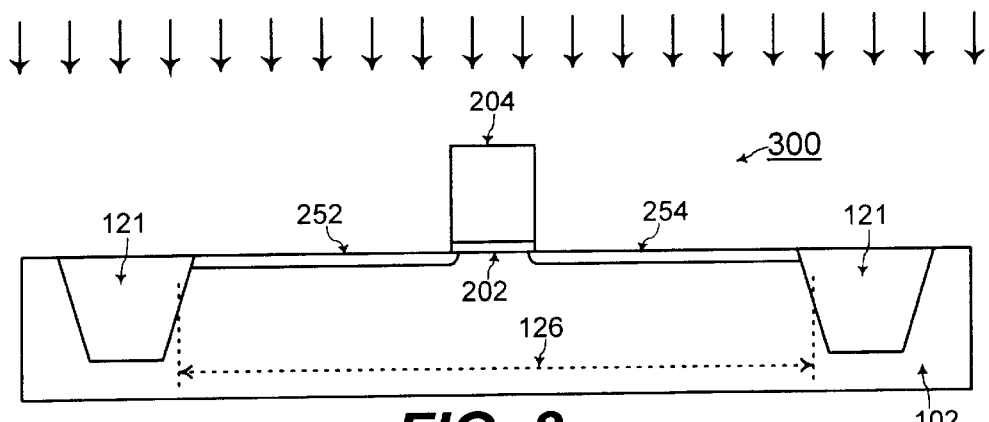
FIGS. 8, 9, 10, and 11 show cross-sectional views for illustrating the steps for fabricating a field effect transistor using dual laser thermal anneal processes for activating dopant within the extension and contact junctions of the field effect transistor to maintain the extension junctions to remain shallow, with the extension junctions being formed before the contact junctions, according to another embodiment of the present invention.

In FIGS. 2, 3, 4, 5, and 6, the contact junctions 210 and 212 are formed before formation of the extension junctions 214 and 216 for the MOSFET 200. In another embodiment of the present invention, the contact junctions are formed after formation of the extension junctions in the MOSFET 300 of FIGS. 8, 9, 10, and 11. Referring to FIG. 8, after formation of the gate dielectric 202 and the gate electrode 204 on a portion of the active device area 126 of the semiconductor substrate 102, an extension dopant is implanted into exposed regions of the active device area 126 of the semiconductor substrate 102 to form a drain extension junction 252 and a source extension junction 254. The extension dopant is implanted such that the drain and source extension junctions 252 and 254 are relatively shallow junctions for minimizing short channel effects.

The extension dopant is an N-type dopant such as phosphorous or arsenic for example for fabrication of an NMOSFET (N-channel Metal Oxide Semiconductor Field Effect Transistor). Alternatively, the extension dopant is a P-type dopant such as boron for example for fabrication of a PMOSFET (P-channel Metal Oxide Semiconductor Field Effect Transistor). Processes for implantation of such extension dopant are known to one of ordinary skill in the art of integrated circuit fabrication.

Figure 9:
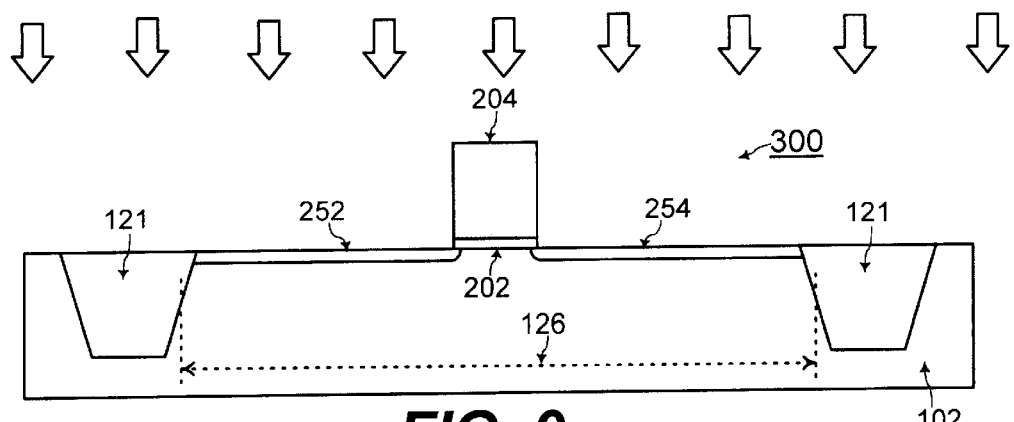

Referring to FIG. 9, the extension dopant within the drain and source extension junctions 252 and 254 is activated in an extension laser thermal anneal process. In such a laser thermal anneal process, a laser beam is directed toward the semiconductor substrate 102. In one embodiment of the present invention, during the extension laser thermal anneal process, a laser beam having an extension fluence in a range of from about 0.2 Joules/$cm^2$ to about 0.4 Joules/$cm^2$ is directed toward the semiconductor substrate 102 including the drain and source extension junctions 252 and 254 for a time period of from about 1 nanosecond to about 10 nanoseconds. In such a short time period, the extension dopant within the drain and source extension junctions 252 and 254 is activated with minimized thermal diffusion of the extension dopant such that the drain and source extension junctions 252 and 254 remain shallow. Laser thermal anneal processes in general are known to one of ordinary skill in the art of integrated circuit fabrication.

Figure 10:
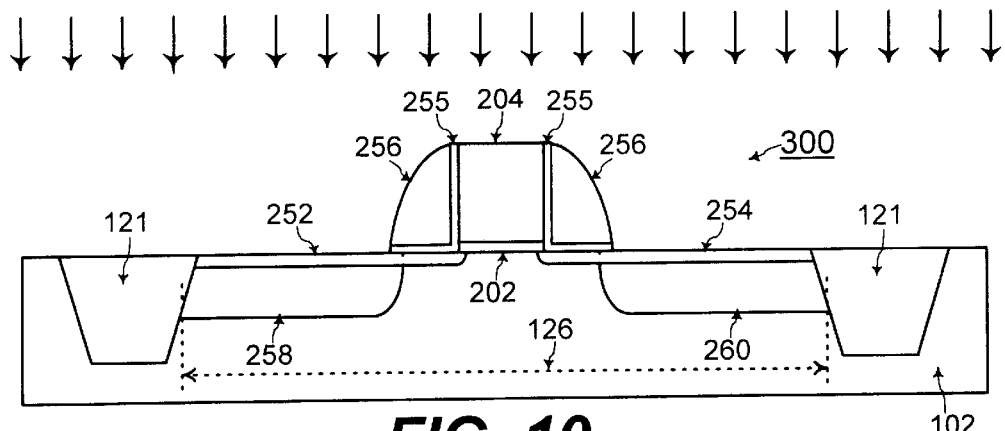

Referring to FIG. 10, after formation of the drain and source extension junctions 252 and 254, spacers 256 are formed at the sidewalls of the gate dielectric 202 and the gate electrode 204. The spacers 256 are comprised of silicon nitride ($Si_3N_4$) according to one embodiment of the present invention. In that case, a spacer liner oxide 255 is formed between the spacers 256 and the sidewalls of the gate dielectric 202 and the gate electrode 204 and the semiconductor substrate 102. Processes for formation of the spacers 256 and the spacer liner oxide 255 are known to one of ordinary skill in the art of integrated circuit fabrication.

Further referring to FIG. 10, a contact dopant is implanted into exposed regions of the active device area 126 of the semiconductor substrate 102 to form a drain contact junction 258 and a source contact junction 260. The contact dopant is implanted such that the drain and source contact junctions 258 and 260 are relatively deep junctions for later formation of silicide therein. The contact dopant is an N-type dopant such as phosphorous or arsenic for example for fabrication of an NMOSFET (N-channel Metal Oxide Semiconductor Field Effect Transistor). Alternatively, the contact dopant is a P-type dopant such as boron for example for fabrication of a PMOSFET (P-channel Metal Oxide Semiconductor Field Effect Transistor). Processes for implantation of such contact dopant are known to one of ordinary skill in the art of integrated circuit fabrication.

Figure 11:
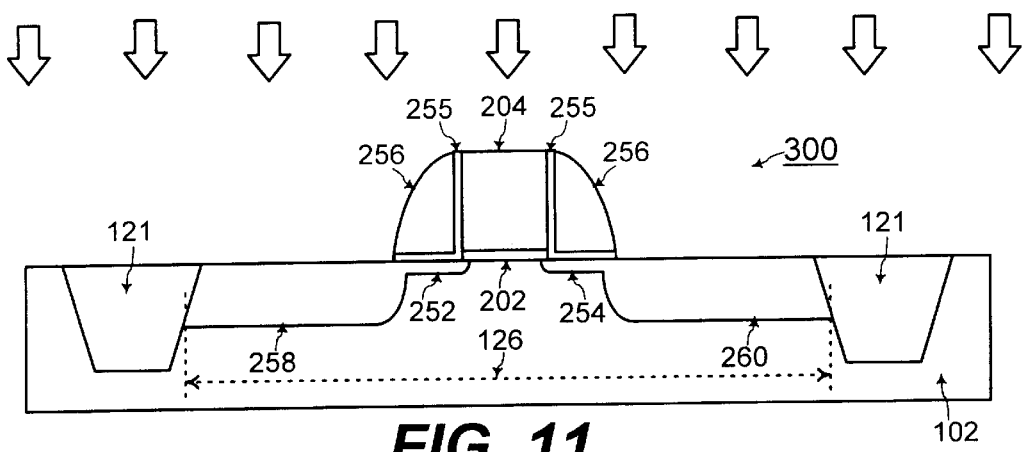

Referring to FIG. 11, the contact dopant within the drain and source contact junctions 258 and 260 is activated in a contact laser thermal anneal process. In such a laser thermal anneal process, a laser beam is directed toward the semiconductor substrate 102. In one embodiment of the present invention, during the contact laser thermal anneal process, a laser beam having a contact fluence in a range of from about 0.5 Joules/$cm^2$ to about 0.8 Joules/$cm^2$ is directed toward the drain and source contact junctions 258 and 260 for a time period of from about 1 nanosecond to about 10 nanoseconds.

In such a short time period, the contact dopant within the drain and source contact junctions 258 and 260 is activated with minimized thermal diffusion of the contact dopant. In addition, the spacers 256 cover a portion of the semiconductor substrate 102 from being exposed to the laser beams such that the portion of the semiconductor substrate 102 covered under the spacers 256 does not heat up significantly during the contact laser thermal anneal process. In one embodiment of the present invention, the spacers 256 are comprised of silicon nitride ($Si_3N_4$) instead of silicon dioxide ($SiO_2$) because silicon nitride ($Si_3N_4$) more effectively blocks the laser beams from the semiconductor substrate 102 than silicon dioxide ($SiO_2$) that is transparent.

Thus, the extension dopant within the drain and source extension junctions 252 and 254 does not thermally diffuse such that the drain and source extension junctions 252 and 254 remain shallow. In addition, the contact dopant remains substantially within the drain and source contact junctions 258 and 254 which may melt into liquid form, and the contact dopant does not diffuse under the spacers 256 since the semiconductor substrate below the spacers 256 remain substantially solid. Laser thermal anneal processes in general are known to one of ordinary skill in the art of integrated circuit fabrication.

In this manner, dual laser thermal anneal processes are performed for activating dopant within the contact and extension junctions 252, 254, 256, and 258 of the MOSFET 300 such that conventional thermal anneal processes may not be used to activate the dopant within such junctions. In such laser thermal anneal processes, a laser beam is directed toward the junctions for a short time duration of from about 1 nanosecond to about 10 nanoseconds. With such laser thermal anneal processes, thermal diffusion of dopant within the extension junctions is minimized such that the extension junctions remain shallow to minimize short channel effects of the MOSFET 300.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "side" and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor on an active device area of a semiconductor substrate, the method including the steps of:
    A. forming a gate dielectric and a gate electrode on a portion of said active device area of said semiconductor substrate;
    B. forming first spacers on sidewalls of said gate electrode and said gate dielectric;
    C. implanting a contact dopant into exposed regions of said active device area of said semiconductor substrate to form a drain contact junction and a source contact junction;
    D. performing a contact laser thermal anneal with a contact laser fluence to activate said contact dopant within said drain and source contact junctions;
    E. removing said first spacers on said sidewalls of said gate electrode and said gate dielectric;
    F. implanting an extension dopant into exposed regions of said active device area of said semiconductor substrate to form a drain extension junction and a source extension junction;
    G. performing an extension laser thermal anneal with an extension laser fluence to activate said extension dopant within said drain and source extension junctions; and
    H. performing said step D of performing said contact laser thermal anneal as a separate step from said step G of performing said extension laser thermal anneal such that said contact laser fluence used for said contact laser thermal anneal is different from said extension laser fluence used for said extension laser thermal anneal.

2. The method-of claim 1, further including the steps of:
    forming second spacers on sidewalls of said gate dielectric and said gate electrode and over said drain and source extension junctions.

3. The method of claim 2, further including the steps of:
    forming a drain silicide with said drain contact junction and forming a source silicide with said source contact junction; and forming a gate silicide with said gate electrode comprised of polysilicon.

4. The method of claim 3, wherein said drain, source, and gate suicides are comprised of nickel silicide (NiSi).

5. The method of claim 4, wherein a silicidation process for forming said drain, source, and gate suicides is performed at a temperature in a range of from about 400° Celsius to about 500° Celsius.

6. The method of claim 1, wherein said contact fluence of said contact laser thermal anneal is in a range of from about 0.5 Joules/cm$^2$ to about 0.8 Joules/cm$^2$.

7. The method of claim 6, wherein said extension fluence of said extension laser thermal anneal is in a range of from about 0.2 Joules/cm$^2$ to about 0.4 Joules/cm$^2$.

8. The method of claim 1, wherein said first spacers are comprised of silicon nitride ($Si_3N_4$) and a spacer liner oxide ($SiO_2$).

9. The method of claim 1, wherein said semiconductor substrate is comprised of silicon, wherein said gate electrode is comprised of polysilicon, and wherein said gate dielectric is comprised of a dielectric material having a dielectric constant that is higher than the dielectric constant of silicon.

10. The method of claim 1, wherein said contact and extension dopants are comprised of an N-type dopant for fabrication of an NMOSFET (N-channel Metal Oxide Semiconductor Field Effect Transistor), and wherein said contact and extension dopants are comprised of a P-type dopant for fabrication of a PMOSFET (P-channel Metal Oxide Semiconductor Field Effect Transistor).

11. The method of claim 1, wherein said extension laser fluence of said extension laser thermal anneal is lower than said contact laser fluence of said contact laser thermal anneal.

12. The method of claim 1, wherein said extension laser fluence of said extension laser thermal anneal is lower than said contact laser fluence of said contact laser thermal anneal.

* * * * *